United States Patent [19]
Freitag

[11] Patent Number: 5,553,538
[45] Date of Patent: Sep. 10, 1996

[54] METHOD AND APPARATUS FOR STENCIL PRINTING PRINTED CIRCUIT BOARDS

[75] Inventor: Brandon R. Freitag, Bartlett, Ill.

[73] Assignee: Motorola, Inc., Schaumburg, Ill.

[21] Appl. No.: 380,476

[22] Filed: Jan. 30, 1995

[51] Int. Cl.⁶ .............................. B41M 1/12; B41F 15/12
[52] U.S. Cl. .................. 101/123; 101/126; 101/129; 101/484; 101/486; 101/DIG. 36
[58] Field of Search .................................. 101/114, 123, 101/126, 127, 129, 481, 484, 485, 486, DIG. 36; 427/96

[56] References Cited

U.S. PATENT DOCUMENTS

| | | | |
|---|---|---|---|
| 4,872,261 | 10/1989 | Sanyal et al. | 29/840 |
| 4,893,556 | 1/1990 | Takahashi et al. | 101/481 |
| 5,001,829 | 3/1991 | Schelhorn | 29/840 |
| 5,197,655 | 3/1993 | Leerssen et al. | 228/254 |
| 5,232,736 | 8/1993 | Tribbey et al. | 427/8 |
| 5,254,362 | 10/1993 | Shaffer et al. | 427/96 |
| 5,261,593 | 11/1993 | Casson et al. | 228/180.22 |
| 5,324,569 | 6/1994 | Nagesh et al. | 428/198 |
| 5,339,536 | 8/1994 | Buttars | 33/613 |
| 5,346,118 | 9/1994 | Degani et al. | 228/180.32 |

FOREIGN PATENT DOCUMENTS

| | | | |
|---|---|---|---|
| 107839 | 7/1982 | Japan | 101/123 |
| 14956 | 1/1986 | Japan | 101/123 |
| 146540 | 7/1986 | Japan | 101/129 |
| 283586 | 12/1986 | Japan | 101/129 |
| 212147 | 9/1987 | Japan | 101/123 |
| 1544 | 1/1988 | Japan | 101/123 |
| 153138 | 6/1988 | Japan | 101/123 |
| 247687 | 9/1992 | Japan | 101/129 |
| 347637 | 12/1992 | Japan | 101/129 |

Primary Examiner—Stephen R. Funk
Attorney, Agent, or Firm—Heather L. Creps

[57] ABSTRACT

The method includes loading a printed circuit board (PCB) to a printing machine; aligning a stencil to the PCB when the PCB has been loaded to the printing machine; setting a snap-off distance; dispensing a volume of solder paste onto the stencil, the volume of solder paste being dispensed onto the stencil regardless of whether the PCB has been loaded to the printing machine; placing a squeegee in contact with the stencil at a predetermined pressure; moving the squeegee across the stencil at a predetermined speed; waiting a constant period of time; and repeating.

16 Claims, 1 Drawing Sheet

METHOD AND APPARATUS FOR STENCIL PRINTING PRINTED CIRCUIT BOARDS

FIELD OF THE INVENTION

The present invention relates generally to printed circuit board (PCB) manufacturing and more particularly to stencil printing.

BACKGROUND OF THE INVENTION

Conventionally, the electronics industry has used screen or stencil printing for mass production soldering of Integrated Circuits (ICs) to Printed Circuit Boards (PCBs). This process involves placing apertures in a metal plate, or stencil, where solder is desired on the PCB. Solder paste is placed on the stencil and pushed through the apertures by a squeegee that moves the solder paste over the stencil. The ICs' leads are then placed in the solder paste deposits on the PCB. Next the PCB, with the ICs, is placed in an oven and heated to at least a liquidous temperature, where the solder particles are melted. This forms a connection between the ICs and the PCB.

As ICs have become more complex, by packaging more functions in a smaller area, the number of leads has increased and the distance between the leads (pitch) has decreased. In fine pitch (i.e., closely spaced leads) applications the importance of printing consistent solder paste volume and alignment is critical. Excessive paste or misalignment results in shorts or bridges and too little paste results in poor connections. These problems show up as defects in the product, resulting in quality problems costing time and money in rework and warranty repairs. This problem is particularly acute in surface mount technologies that have very fine pitches.

The electronic industry has invested a great deal of time and money trying to understand and characterize the screen printing process, in the hope of discovering the key to obtaining consistent solder paste volumes. Research shows that paste volumes are effected by the variance in the apertures in the stencil. Variances in paste volume are also correlated to solder particle size, the speed at which the stencil is removed from the PCB after printing, aperture shape and a wide variety of other factors. Unfortunately, the research also shows that even after controlling for all these factors significant variance in solder paste volumes still occur in fine pitch applications (i.e., 0.025 inches or 0.635 mm).

The electronic industry has developed sophisticated optical alignment techniques to insure the stencil is correctly aligned with the PCB. Despite these precise alignment techniques solder paste deposits are sometimes misaligned with the pads on the PCB.

Thus, there exists a need for a stencil printing method and apparatus that can reduce the variance in solder paste volumes and decrease the occurrences of misaligned solder paste deposits.

DETAILED DESCRIPTION OF THE DRAWINGS

In summary, the present invention provides a method and a machine for obtaining consistent solder paste volumes and accurate alignments of solder paste deposits in fine pitch applications. The consistent solder paste volumes are obtained by insuring the solder paste is printed periodically. Periodic printing is the key to obtaining consistent solder paste volumes once the other major variables have been controlled. The reason for this, the inventor believes, is that the rheological properties of the solder paste are altered by the printing process. If the printing is done periodically, the rheological property of the solder paste will always be the same. The accurate solder paste deposit alignments are obtained by purposely misaligning the stencil or offsetting the stencil in the opposite direction of the travel of the squeegee.

Figure 1:
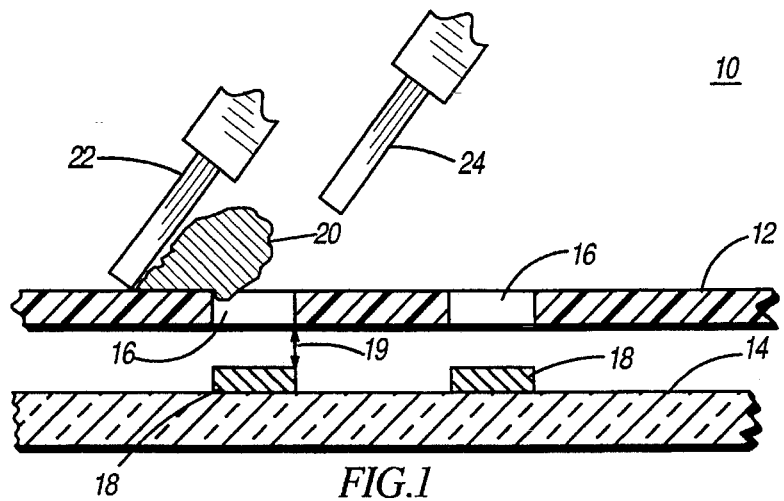
FIG. 1 is a schematic diagram of a stencil printing operation.

FIG. 1 shows a schematic diagram of a stencil printing process 10. A stencil 12 is aligned above a PCB 14, so that a plurality of apertures 16 is directly above a plurality of metal pads 18. The distance 19 between the top of the pads 18 and the bottom of the stencil 12 or snap off distance 19 is controlled. A solder paste 20 is placed on the stencil 12 and moved across (printed) the stencil 12 by a squeegee 22. A second squeegee 24 is used to print the paste in the opposite direction. As the squeegee 22 moves across the stencil the solder paste 20 is pushed through the apertures 16 onto the pads 18. This process is called printing and it prepares the PCB to receive ICs (not shown). The leads of the ICs are placed on the pads 18 now covered in solder paste. Then the PCB with the leads is placed in an oven to liquefy the solder paste and form permanent electrical connections.

To obtain consistent solder paste 20 volumes on the PCB 14 it is necessary that the solder paste 20 be printed (i.e., moved across the stencil 12) at constant time intervals. Research shows that the exact time interval is not critical as long as it is less than about ten minutes. Other important factors are: the snap off distance 19, the pressure applied by the squeegee 22 to the stencil 12, and the print speed of the squeegee 22. In the preferred embodiment, the snap off distance is between 0.015 to −0.015 inches (0.381 to −0.381 mm), the squeegee pressure is between 30 and 40 pounds per square inch (207–276 KPa), and the print speed is between 0.3 to 0.7 in/sec (7.62 to 17.8 mm/sec).

An alternative method for obtaining consistent solder paste volumes in a stencil printing operation can be obtained by first sampling the viscosity (part of the rheological properties) of the solder paste prior to printing. One way to test the viscosity is to keep track of the last time the solder paste was printed or stirred. This works because the solder paste's viscosity is time dependent (i.e., the viscosity of the solder paste increases the longer it is at rest). If the viscosity of solder paste is within a predetermined range then printing can occur. If the solder paste viscosity is less than the predetermined range then the printing operation waits until the solder paste viscosity is increased so it is in the range. If the solder paste viscosity is too high then the solder paste is agitated and then left at rest a predetermined time before printing with the solder paste.

Figure 2:
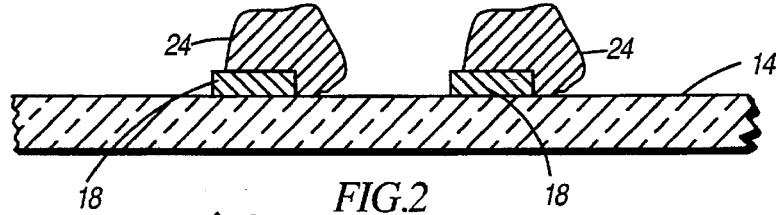
FIG. 2 is a schematic diagram of a printed circuit board after the stencil printing operation.
Figure 3:
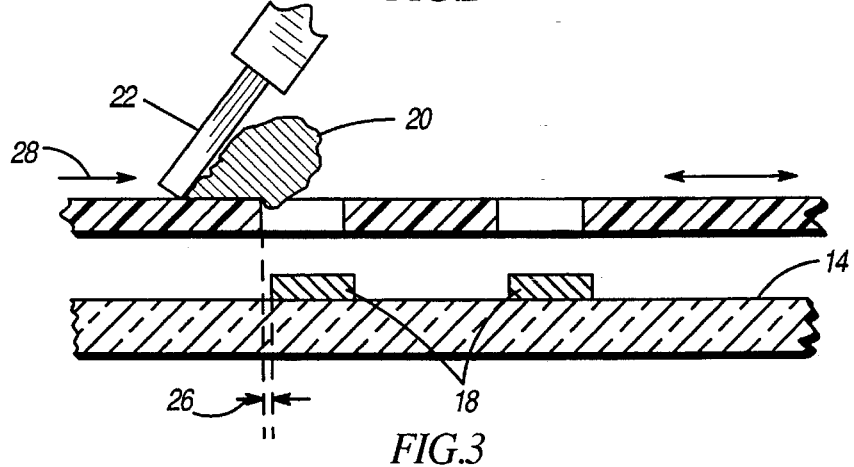
FIG. 3 is a schematic diagram of a stencil printing operation with an alignment offset.

In addition to obtaining consistent solder paste volumes it is necessary to obtain accurate solder paste deposit alignments to avoid bridges and poor IC lead connections. The inventor has found that if the PCB 14 is printed with the stencil 12 aligned so that the apertures 16 perfectly overlap the metal pads 18 the solder paste deposits 24 are misaligned, as shown in FIG. 2. The direction of the misalignment is in the direction of travel of the squeegee blade 22. The amount of misalignment or offset necessary to counteract the misalignment depends on the print speed, the squeegee pressure, the type of solder paste and other factors. In the preferred embodiment, the amount of offset 26, shown in FIG. 3, to achieve alignment varies between 0.01 to 0.03 inches (0.2154 to 0.762 mm). Note that the offset 26 is in the opposite direction of the direction of travel, shown as arrow 28.

Figure 4:
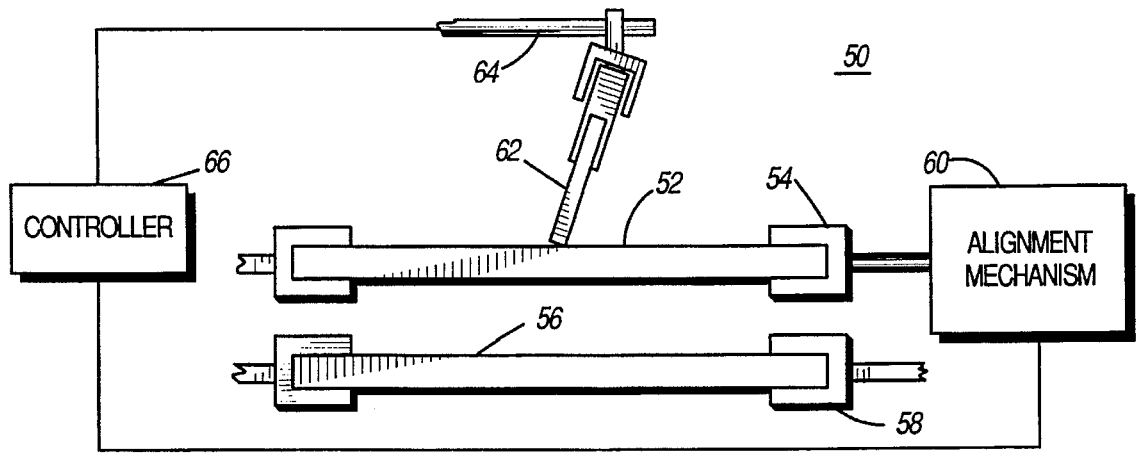
FIG. 4 is a schematic diagram of a stencil printing machine.

FIG. 4 shows an automated stencil printing machine 50 able to advantageously perform this periodic printing time interval to produce consistent solder paste volumes and to automatically adjust the stencil offset based upon the direction of printing. A stencil 52 is held by a stencil holder 54 and aligned above a PCB 56, held by a PCB holder 58, by an alignment mechanism 60. The alignment mechanism 60 can position the stencil 52 along the X,Y,Z and Φ axis. Normally, the alignment mechanism will have a sensor mechanism to determine when the stencil 52 is correctly aligned with the PCB 56. A squeegee 62 is positioned on top of the stencil 52 and is moved across the stencil 52 by a squeegee mechanism 64. The squeegee mechanism 64 has two squeegees one for pushing the solder paste in one direction and a second for moving the solder paste back in the other direction. The squeegee mechanism 62 also applies the appropriate pressure on the squeegee, so the squeegee's pressure on the stencil 52 is correct. The alignment mechanism 60 and the squeegee mechanism 64 are coupled to a controller 66. The controller 66 determines the print speed of the squeegee, the squeegee pressure, when the squeegee prints and the appropriate alignment by the alignment mechanism 60 depending on the direction of printing. The controller 66 attempts to print boards at consistent intervals to obtain the consistent solder paste volumes. However if a board cannot be printed at the appropriate time the controller 66 will print a test board and then wait the appropriate period of time to print the next board. By printing the test board the controller can re-start the periodic printing and obtain consistent solder paste volumes. The controller 66 also adjust the offset 26 for each print according to the direction of travel of the squeegee 62.

Thus there has been described a method and apparatus for obtaining consistent solder paste deposit volumes and accurate alignment of the solder paste deposits on the associated pads. Using this method and apparatus, highly reliable solder joints can be produced for PCBs.

What is claimed is:

1. A method of printing solder paste, the method comprising the steps of:

a) loading a printed circuit board (PCB) to a printing machine;

b) aligning a stencil to the PCB when the PCB has been loaded to the printing machine;

c) setting a snap-off distance;

d) dispensing a volume of solder paste onto the stencil, the volume of solder paste being dispensed onto the stencil regardless of whether the PCB has been loaded to the printing machine;

e) placing a squeegee in contact with the stencil at a predetermined pressure;

f) moving the squeegee across the stencil at a predetermined speed;

g) waiting a constant period of time; and h) repeating from step a.

2. The method of claim 1, wherein step (b) further comprises the step of offsetting the stencil from the PCB a predetermined horizontal distance.

3. The method of claim 2, wherein the predetermined distance is determined based upon the predetermined pressure of the squeegee.

4. The method of claim 2, wherein the step of offsetting the stencil further comprises the step of offsetting the stencil a predetermined horizontal distance in the opposite direction of travel of the squeegee.

5. The method of claim 4, wherein the predetermined distance is determined based upon the predetermined speed of the squeegee.

6. An automated stencil printing machine comprising:

a stencil holder;

a printed circuit board (PCB) holder;

an alignment mechanism coupled to the stencil holder for positioning a stencil with respect to a PCB;

a squeegee mechanism for moving a volume of solder paste across the stencil, the volume of solder paste moved across the stencil regardless of whether the stencil has been positioned with respect to the PCB;

a test board, the volume of solder paste printed onto the test board when the stencil has not been positioned with respect to the PCB; and a controller, coupled to the alignment mechanism and the squeegee mechanism, for controlling the alignment mechanism and for moving the solder paste across the stencil at constant intervals, via the squeegee mechanism.

7. The automated stencil printing machine of claim 6, wherein the squeegee mechanism has a squeegee for contact with the stencil and the squeegee mechanism for applying a predetermined pressure on the stencil.

8. The automated stencil printing machine of claim 7, wherein the predetermined pressure on the squeegee mechanism is between 30 and 40 pounds per square inch (207–276 KPa).

9. The automated stencil printing machine of claim 6 wherein the alignment mechanism offsets the stencil from the PCB a predetermined horizontal distance in a direction opposite from a direction of travel of the squeegee mechanism.

10. The automated stencil printing machine of claim 9 wherein the predetermined horizontal distance is calculated by the controller based upon a print speed of the squeegee mechanism.

11. The automated stencil printing machine of claim 9 wherein the predetermined horizontal distance is calculated by the controller based upon a predetermined pressure of the squeegee mechanism.

12. The automated stencil printing machine of claim 9, wherein the predetermined horizontal distance is between 0.01 and 0.03 inches (0.254 to 0.762 mm).

13. The automated stencil printing machine of claim 6, wherein the squeegee mechanism moves across the stencil at a predetermined speed.

14. The automated stencil printing machine of claim 13, wherein the predetermined speed is between 0.3 to 0.7 inches/sec (7.62 to 17.8 mm/sec).

15. The automated stencil printing machine of claim 6, wherein the constant interval is less than ten minutes.

16. A method of printing solder paste, the method comprising the steps of:

a) loading circuit boards;

b) receiving the circuit boards at a printing machine; and c) at the printing machine, periodically dispensing a volume of solder paste onto a stencil at a constant rate, the volume of solder paste being dispensed onto the stencil regardless of whether a circuit board has been received at the printing machine, the volume of solder paste being printed onto a test board when no circuit board has been received at the printing machine.

* * * * *